(12) United States Patent
Sugawara et al.

(10) Patent No.: US 8,885,915 B2
(45) Date of Patent: Nov. 11, 2014

(54) METHOD FOR MEASURING AND CONTROLLING DISTANCE BETWEEN LOWER END SURFACE OF HEAT SHIELDING MEMBER AND SURFACE OF RAW MATERIAL MELT AND METHOD FOR MANUFACTURING SILICON SINGLE CRYSTAL

(75) Inventors: Kosei Sugawara, Nishishirakawa (JP); Masahiko Urano, Nishishirakawa (JP); Ryoji Hoshi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 164 days.

(21) Appl. No.: 13/696,772

(22) PCT Filed: Apr. 28, 2011

(86) PCT No.: PCT/JP2011/002499
§ 371 (c)(1),
(2), (4) Date: Nov. 7, 2012

(87) PCT Pub. No.: WO2011/158425
PCT Pub. Date: Dec. 22, 2011

(65) Prior Publication Data
US 2013/0058540 A1  Mar. 7, 2013

(30) Foreign Application Priority Data

Jun. 16, 2010  (JP) .................................. 2010-136937

(51) Int. Cl.
*G06K 9/00*  (2006.01)
*C03B 29/06*  (2006.01)
*C30B 15/26*  (2006.01)

(52) U.S. Cl.
CPC ................. *C03B 29/06* (2013.01); *C30B 15/26* (2013.01)
USPC ....................................................... 382/141

(58) Field of Classification Search
None
See application file for complete search history.

(56) References Cited

U.S. PATENT DOCUMENTS

| 5,437,242 A | 8/1995 | Hofstetter et al. |
| 5,487,354 A | 1/1996 | von Ammon et al. |

(Continued)

FOREIGN PATENT DOCUMENTS

| JP | A-6-56588 | 3/1994 |
| JP | A-6-116083 | 4/1994 |

(Continued)

OTHER PUBLICATIONS

Ueki et al., "Analysis of Side-Wall Structure of Grown-in Twin-Type Octahedral Defects in Czochralski Silicon," *Jpn. J. Appl. Phys.*, vol. 37, No. 4A, Part I, pp. 1667-1670, Apr. 1998.

(Continued)

*Primary Examiner* — Shervin Nakhjavan
(74) *Attorney, Agent, or Firm* — Oliff PLC

(57) ABSTRACT

A method for measuring a distance between a lower end surface of a heat shielding member including a criterion reflector inside a concavity on the lower end surface and a surface of a raw material melt includes: a silicon single crystal is pulled by the Czochralski method while a magnetic field is applied to the raw material melt in a crucible, measuring the distance between the lower end surface of the heat shielding member and the surface of the raw material melt and observing a position of a mirror image of the criterion reflector with a fixed point observation apparatus; and measuring a movement distance of the mirror image with the apparatus and calculating the distance between the lower end surface of the heat shielding member and the surface of the raw material melt from the movement distance of the image and the measured distance.

30 Claims, 4 Drawing Sheets

(56) References Cited

U.S. PATENT DOCUMENTS

| | | |
|---|---|---|
| 7,264,674 B2 | 9/2007 | Takanashi et al. |
| 8,085,985 B2 | 12/2011 | Urano et al. |
| 2003/0116729 A1* | 6/2003 | Moriya et al. ............ 250/577 |
| 2010/0064964 A1 | 3/2010 | Hoshi et al. |

FOREIGN PATENT DOCUMENTS

| | | |
|---|---|---|
| JP | A-7-257991 | 10/1995 |
| JP | A-2001-342095 | 12/2001 |
| JP | A-2001-342097 | 12/2001 |
| JP | A-2006-256898 | 9/2006 |
| JP | A-2007-290906 | 11/2007 |
| JP | A-2008-195545 | 8/2008 |
| WO | WO 01/83859 A1 | 11/2001 |

OTHER PUBLICATIONS

Hourai et al., "Control of Grown-in Defects in Si Crystal Growth," *Japanese Association for Crystal Growth*, vol. 25, No. 5, pp. 207-213, 1998 (with English Abstract).

Takeno et al., "Evaluation of Microdefects in As-Grown Silicon Crystals," *Mat. Res. Soc. Symp. Proc.*, vol. 262, pp. 51-56, 1992.

Voronkov., "The Mechanism of Swirl Defects Formation in Silicon," *Journal of Crystal Growth*, vol. 59, No. 3, pp. 625-643, 1982.

Jun. 14, 2011 International Search Report issued in International Patent Application No. PCT/JP2011/002499.

* cited by examiner (a)

(b)

METHOD FOR MEASURING AND CONTROLLING DISTANCE BETWEEN LOWER END SURFACE OF HEAT SHIELDING MEMBER AND SURFACE OF RAW MATERIAL MELT AND METHOD FOR MANUFACTURING SILICON SINGLE CRYSTAL

TECHNICAL FIELD

The present invention relates to a method for measuring a distance between a lower end surface of a heat shielding member located above the surface of the raw material melt and a surface of a raw material melt when a silicon single crystal is pulled from the raw material melt in a crucible by the Czochralski method, and a method for controlling the distance.

BACKGROUND ART

The Czochralski method (CZ method), in which a silicon single crystal is grown and pulled from a raw material melt in a quartz crucible, has been widely implemented as a method for manufacturing a silicon single crystal for use in fabrication of a semiconductor device. In the CZ method, a seed crystal is dipped into the raw material melt (silicon melt) in the quartz crucible under an inert gas atmosphere, and the seed crystal is pulled while the quartz crucible and the seed crystal are rotated so that a silicon single crystal having a desired diameter is grown.

In recent years, grown-in defects in silicon wafers becomes an issue as higher integration of semiconductor devices and accompanying shrinking feature sizes are advanced. The grown-in defect is a factor in deteriorated characteristics of semiconductor devices and the advancement of the shrinking feature sizes of a device is heightening the effect of the defect. An octahedral void-type defect, which is an agglomeration of vacancies (See Non-Patent Document 1), and a dislocation cluster, which is formed as an agglomeration of interstitial silicon (See Non-Patent Document 2), in a silicon single crystal by the CZ method are known as such grown-in defects.

Non Patent Document 3 discloses that the amount of the grown-in defects being introduced depends on a temperature gradient at a crystal-growth interface and a growth rate of a silicon single crystal. As a method for manufacturing a low defect silicon single crystal by utilizing the dependency, for example, Patent Document 1 discloses making the growth rate of a silicon single crystal slower, and Patent document 2 discloses that a silicon single crystal is pulled at a rate less than the maximum pulling rate that is substantially proportional to a temperature gradient at a boundary region between a solid phase and a liquid phase of the silicon single crystal. Moreover, an improved CZ method focusing attention to the temperature gradient (G) and the growth rate (V) during crystal growth has been reported (Non Patent Document 4). In this method, it is necessary to control the crystal temperature gradient with high precision.

In these methods, a structure in cylindrical form or inverted cone form for shielding radiant heat (heat shielding member) is provided around the silicon single crystal being grown above a melt surface to control the crystal temperature gradient. The structure enables the crystal temperature gradient of a high temperature crystal to increase and thus brings an advantage in that a defect-free crystal can be rapidly obtained. For precise control of the crystal temperature gradient, however, it is necessary to control highly precisely such that a distance between the lower end surface of the heat shielding member located above the surface of the raw material melt and the surface of the raw material melt (hereinafter, also referred to as DPM: Distance from the purge tube to the melt surface) is brought to a predetermined distance.

However, it is difficult to control the DPM precisely so as to maintain a predetermined distance by a conventional method.

As the crystal diameter increases, the position of the melt surface widely varies in dependence on, for example, the weight (variation in thickness), deformation, and expansion in its operation of the quartz crucible. Thus, there arises a problem in that the position of the melt surface varies every crystal growth batch. Because of the problem, controlling the distance between the melt surface and the heat shielding member precisely so as to maintain a predetermined distance becomes more difficult.

For improvement of the problem, for example, Patent Document 3 proposes that a criterion reflector be provided in a CZ furnace to measure the distance between the criterion reflector and the melt surface by measuring a relative distance between a real image of the criterion reflector and a mirror image of the criterion reflector reflected on the melt surface. In Patent Document 3, the distance between the melt surface and the heat shielding member is controlled precisely on the basis of the measurement result so as to maintain a predetermined distance.

Moreover, Patent Document 4 discloses a method for stabilizing the mirror image of the criterion reflector by taking account of a curve of the raw material melt due to rotation of the crucible.

Patent Document 5 discloses a method for improving a positional detection error by applying a magnetic field to reflect an image clearly.

In these methods, the real image of the criterion reflector and the mirror image of the criterion reflector are captured with a detection means such as an optical camera, and light and darkness of the captured real image and mirror image of the criterion reflector are quantized (binarization) into two levels on the basis of a predetermined threshold (threshold for a binarization level). That is, the light and darkness are distinguished by a lighter part or a darker part than the threshold for a binarization level. The position of the edge between them is measured and the measured value is converted so that the distance from the real image or the mirror image is measured.

However, there is a problem in that precise measurement of the distance between the criterion reflector and the melt surface cannot be ensured. For example, with the passage of time in a crystal growth step, the brightness of the mirror image of the criterion reflector reflected on the melt surface varies, and the value detected by the optical camera varies before the binarization, or noise differing from that of the mirror image of the criterion reflector, such as a scattered melt attached to a structural part in the CZ furnace, is detected.

Meanwhile, when the raw material melt is contained in a quartz crucible having a diameter of 800 mm or more, for example and a silicon single crystal having a diameter of 300 mm or more is manufactured without applying the magnetic field, there is another problem in that, since the melt surface vibrates, precise detection of the position of the melt surface cannot be ensured. In this case, also, precise measurement of the relative distance between the criterion reflector and the melt surface cannot be ensured.

When the measurement result of the relative distance between the criterion reflector and melt surface is inaccurate, the distance between the melt surface and the heat shielding member cannot be controlled precisely so as to maintain a predetermined distance. As a result, a silicon single crystal with desired quality cannot be manufactured at good productivity.

CITATION LIST

Patent Literature

Patent Document 1: Japanese Unexamined Patent publication (Kokai) No. H06-56588
Patent Document 2: Japanese Unexamined Patent publication (Kokai) No. H07-257991
Patent Document 3: Japanese Unexamined Patent publication (Kokai) No. H06-116083
Patent Document 4: Japanese Unexamined Patent publication (Kokai) No. 2001-342095
Patent Document 5: Japanese Unexamined Patent publication (Kokai) No. 2008-195545
Non Patent Document 1: Analysis of side-wall structure of grown-in twin-type octahedral defects in Czochralski silicon, JPN. J. Appl. Phys. Vol. 37 (1998) p-p. 1667-1670
Non Patent Document 2: Evaluation of microdefects in as-grown silicon crystals, Mat. Res. Soc. Symp. Proc. Vol. 262 (1992) p-p 51-56
Non Patent Document 3: The mechanism of swirl defects formation in silicon, Journal of Crystal growth, 1982, p-p 625-643
Non Patent Document 4: Japanese Association For Crystal Growth vol. 25 No. 5, 1998

SUMMARY OF INVENTION

The present invention was accomplished in view of the above-described problems. It is an object of the present invention to provide a method for measuring a distance between a lower end surface of a heat shielding member and a surface of a raw material melt that stably enables precise measurement of the distance between the lower end surface of the heat shielding member and the surface of the raw material melt. It is another object of the present invention to provide a method for manufacturing a high quality silicon single crystal composed of a defect-free region precisely at good productivity by controlling the distance between the lower end surface of the heat shielding member and the surface of the raw material melt for application to silicon single crystal manufacture.

Solution to Problem

To solve the foregoing problems, the present invention provides a method for measuring a distance between a lower end surface of a heat shielding member and a surface of a raw material melt comprising providing the heat shielding member with a criterion reflector, the heat shielding member being located above the surface of the raw material melt, when a silicon single crystal is pulled by the Czochralski method while a magnetic field is applied to the raw material melt in a crucible, the method including: providing the criterion reflector inside a concavity formed on the lower end surface of the heat shielding member; actually measuring the distance between the lower end surface of the heat shielding member and the surface of the raw material melt and observing a position of a mirror image of the criterion reflector with a fixed point observation apparatus, the mirror image being reflected on the surface of the raw material melt; and then measuring a movement distance of the mirror image with the fixed point observation apparatus and calculating the distance between the lower end surface of the heat shielding member and the surface of the raw material melt from the movement distance of the mirror image and the actually measured distance while the silicon single crystal is pulled.

Thus, in the present invention, first, the distance between the lower end surface of the heat shielding member and the surface of the raw material melt is actually measured in a mechanical manner, for example. The position of the mirror image of the criterion reflector reflected on the surface of the raw material melt is then observed with the fixed point observation apparatus. After the observation, the movement distance of the mirror image is measured with the fixed point observation apparatus and the distance between the lower end surface of the heat shielding member and the surface of the raw material melt is calculated from the movement distance of the mirror image and the actually measured distance while the silicon single crystal is pulled. The measurement range of the image observation is thereby limited so that an observation error is reduced, i.e., the distance between the lower end surface of the heat shielding member and the surface of the raw material melt can be measured precisely while the silicon single crystal is pulled. In addition, the silicon single crystal is pulled while the magnetic field is applied so that convection of the raw material melt and hence the wave of the surface of the raw material melt are inhibited. Therefore, the melt surface maintains a mirror state even when the silicon single crystal is pulled, and the mirror image of the criterion reflector is readily observed. Moreover, when the criterion reflector is provided inside the concavity formed on the lower end surface of the heat shielding member, the concavity formed on the lower end surface of the heat shielding member acts as a structure for inhibiting detection error and makes the shade of the mirror image of the criterion reflector clear so that the detection error is inhibited in detection by the binarization with the fixed point observation apparatus. The detection precision of the fixed point observation apparatus can be thereby improved.

Here, the "criterion reflector" in the present invention is used to reflect the mirror image on the surface of the raw material melt. Observing the mirror image enables calculation of the distance between the lower end surface of the heat shielding member and the surface of the raw material melt to control the position of the surface of the raw material melt.

In the method, a high purity white quartz or a high purity transparent quartz whitened is preferably used as the criterion reflector.

When such a high purity quartz is used as the criterion reflector provided at the surface of the raw material melt, the risk of contaminating the silicon single crystal being grown by impurities from the criterion reflector can be lowered. Therefore, a high quality silicon single crystal can be grown. The white criterion reflector enhances visibility of the mirror image on the surface of the raw material malt so that the observation of the mirror image becomes more precisely and thereby a high purity, high quality silicon single crystal can be grown.

In the method, the lower end portion of the criterion reflector is preferably located at a higher position than that of the lower end surface of the heat shielding member.

Only the structure of providing the criterion reflector inside the concavity formed on the lower end surface of the heat shielding member as described above enables this arrangement. When the lower end portion of the criterion reflector is located at a higher position than that of the lower end surface of the heat shielding member, the criterion reflector does not protrude outside and can therefore be prevented from contacting the exterior in handling of the heat shielding member, such as installation and dismantlement so that the criterion reflector can be prevented from being damaged. Also, damage due to collision of the raw material can be inhibited when the raw material is added by using a quartz pipe. Moreover, there is less risk of attaching the raw material melt to the criterion reflector by mistake during operation such as a rise in the crucible.

In the actual measurement of the distance between the lower end surface of the heat shielding member and the surface of the raw material melt, it is preferable that a lower end of a seed crystal for growing the silicon single crystal is detected as a criterion position with a criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

When the lower end of the seed crystal for growing the silicon single crystal is detected as the criterion position with the criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position, the distance between the lower end surface of the heat shielding member and the surface of the raw material melt can be actually measured with a simple operation. Since the distance between the lower end surface of the heat shielding member and the surface of the raw material melt is actually measured with the seed crystal, there is less risk of contamination of the raw material melt by impurities, and a high quality silicon single crystal can be grown. When the lower end of the seed crystal is lowered to between the lower end portion of the criterion reflector and the surface of the raw material melt, there is less risk of attaching the raw material melt to the criterion reflector when the crucible is raised to bring the seed crystal into contact with the surface of the raw material melt.

In the method, a magnetic field strength at a center of the applied magnetic field is preferably a horizontal magnetic field of 300 G to 7000 G.

When the magnetic field strength at the center of the applied magnetic field in the measurement is a horizontal magnetic field of 300 G to 7000 G, the surface of the raw material melt hardly vibrates and fluctuation of the mirror image reflected on the surface of the raw material melt can be inhibited so that the position of the surface of the raw material melt further stabilizes and the movement distance of the mirror image can be measured more precisely.

Furthermore, the present invention provides a method for controlling a distance between a lower end surface of a heat shielding member and a surface of a raw material melt, wherein the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the above measurement method.

In this manner, the crucible or the heat shielding member is moved while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the above measurement method. That is, the distance between the lower end surface of the heat shielding member and the surface of the raw material melt can be measured more stably and precisely. When the distance between the lower end surface of the heat shielding member and the surface of the raw material melt is controlled on the basis of the measurement result, therefore, the distance between the lower end surface of the heat shielding member and the surface of the raw material melt can be controlled with high precision.

Furthermore, the present invention provides a method for manufacturing a silicon single crystal, wherein the silicon single crystal is manufactured while the distance between the lower end surface of the heat shielding member and the surface of the raw material melt is controlled by the above method for controlling the distance between the lower end surface of the heat shielding member and the surface of the raw material melt.

Since the distance between the lower end surface of the heat shielding member and the surface of the raw material melt can be controlled with high precision by using the above control method to manufacture the silicon single crystal, the crystal axis temperature gradient in a direction of a crystal growth axis can be controlled highly precisely, and thereby a high quality silicon single crystal can be efficiently manufactured at high productivity.

Advantageous Effects of Invention

As described above, according to the method for measuring a distance between a lower end surface of a heat shielding member and a surface of a raw material melt of the present invention, the distance between the lower end surface of the heat shielding member and the surface of the raw material melt can be measured more stably and precisely. Controlling the distance between the lower end surface of the heat shielding member and the surface of the raw material melt on the basis of the measurement result enables highly precise control of the distance between the lower end surface of the heat shielding member and the surface of the raw material melt. Therefore, the crystal axis temperature gradient in the direction of the crystal growth axis can be controlled highly precisely, and a high quality silicon single crystal can be efficiently manufactured at high productivity. In addition, when the distance between the lower end surface of the heat shielding member and the surface of the raw material melt is controlled such that it is more than the lowest limit, the contact between the lower end surface of the heat shielding member and the surface of the raw material melt can be prevented, and the silicon single crystal can be grown safely.

DESCRIPTION OF EMBODIMENTS

Hereinafter, embodiments of the present invention will be described with reference to drawings, but the present invention is not limited to these embodiments.

Figure 1:
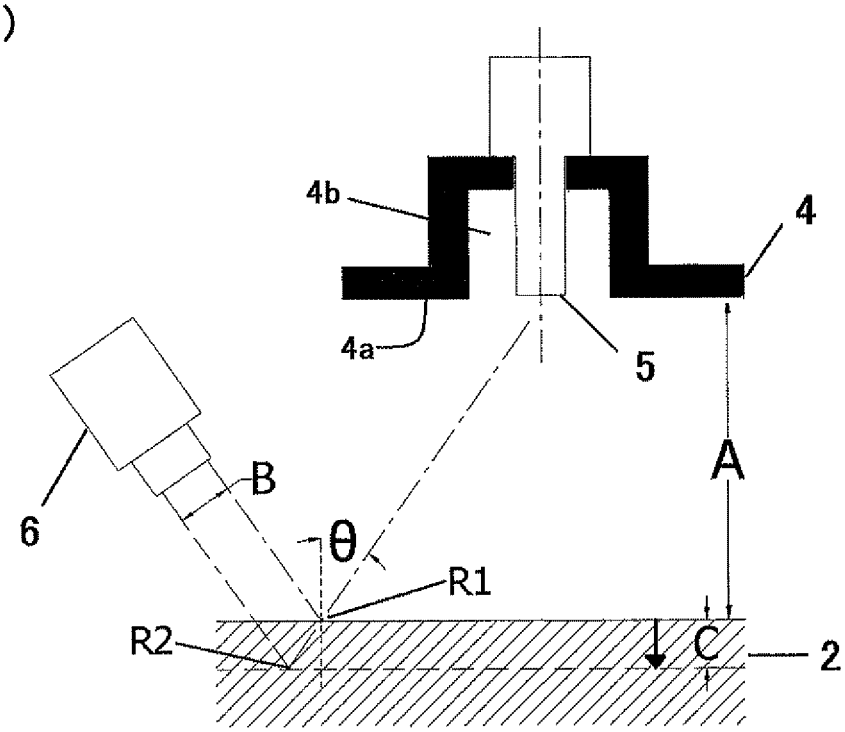
FIG. 1 illustrates diagrams for explanation of the method for measuring the distance between the lower end surface of the heat shielding member and the surface of the raw material melt of the present invention.
Figure 1:
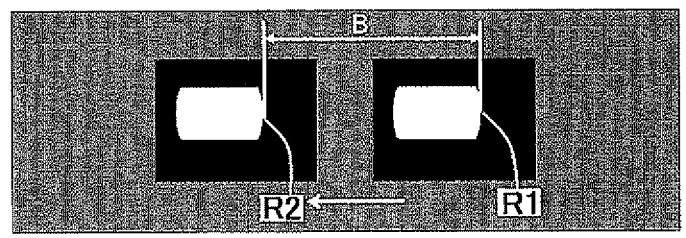
Figure 2:
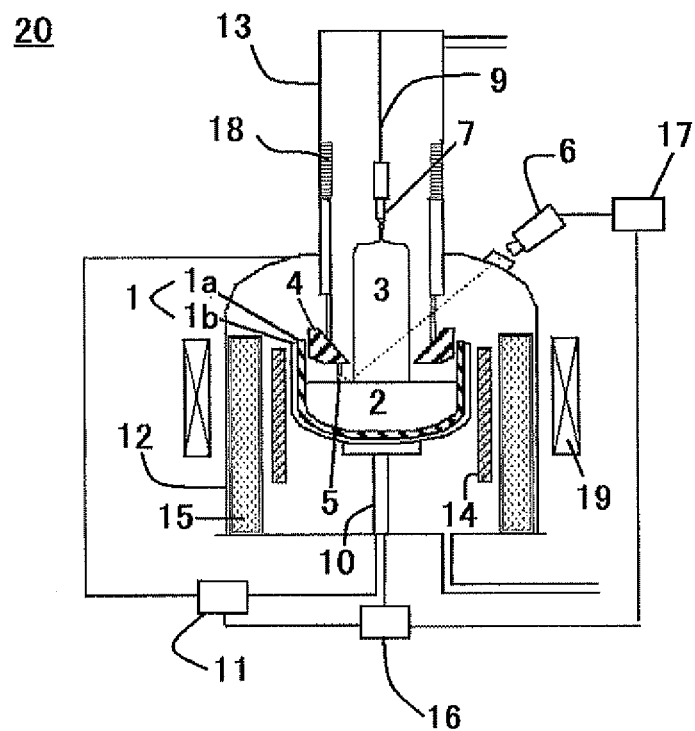
FIG. 2 is a schematic diagram of a single crystal manufacturing apparatus used when the silicon single crystal is pulled with the method for measuring the distance between the lower end surface of the heat shielding member and the surface of the raw material melt of the present invention.

FIG. 1 illustrates diagrams for explanation of the method for measuring the distance between the lower end surface of the heat shielding member and the surface of the raw material melt of the present invention. FIG. 1(a) is a diagram showing movement of the surface of the raw material melt and the positional relationship among parts. FIG. 1(b) is a schematic diagram of an image obtained with the fixed point observation apparatus. FIG. 2 is a schematic diagram of a single crystal manufacturing apparatus used when the silicon single crystal is pulled with the method for measuring the distance between the lower end surface of the heat shielding member and the surface of the raw material melt of the present invention.

Before the silicon single crystal 3 is pulled by the Czochralski method while the magnetic field is applied to the raw material melt 2 in the crucible 1 as shown in FIG. 2, the criterion reflector 5 is provided, as the detection error inhibiting structure, inside the concavity 4b formed on the lower end surface 4a of the heat shielding member 4 located above the raw material melt 2 as shown in FIG. 1(a). Next, the distance A between the lower end surface of the heat shielding member 4 and the surface of the raw material melt 2 is actually measured, and the position of the mirror image R1 of the criterion reflector 5, reflected on the surface of the raw material melt is observed with the fixed point observation apparatus 6. The movement distance B of the mirror image is measured (measured at the position of R2) with the fixed point observation apparatus 6 and the distance between the lower end surface of the heat shielding member and the surface of the raw material melt is calculated from the movement distance B of the mirror image and the actually measured distance A while the silicon single crystal 3 is pulled.

Providing the criterion reflector 5 inside the concave lower end surface of the heat shielding member makes light and darkness representing the position of the criterion reflector and other parts clearer than the conventional arrangement, thereby making the shade of the criterion reflector 5 and its background clearer. Therefore, variation in detection values by the binarization is inhibited so that the distance between the lower end surface of the heat shielding member and the surface of the raw material melt can be measured more stably and precisely. Moreover, when the distance A between the lower end of the heat shielding member 4 and the surface of the raw material melt 2 is actually measured, the position of the mirror image of the criterion reflector 5 reflected on the surface of the raw material melt 2 is observed with the fixed point observation apparatus 6, the movement distance of the mirror image is then measured with the fixed point observation apparatus 6, and the distance between the lower end surface of the heat shielding member and the surface of the raw material melt is calculated from the movement distance B of the mirror image and the actually measured distance A while the silicon single crystal is pulled, the measurement range of the image observation is limited to the range of the mirror image so that the observation error in the fixed point observation apparatus 6 is reduced, i.e., the distance between the lower end surface of the heat shielding member 4 and the surface of the raw material melt 2 can be measured precisely while the silicon single crystal is pulled.

In addition, when the silicon single crystal 3 is pulled while the magnetic field is applied, the convection of the raw material melt 2 and hence the wave of the surface of the raw material melt 2 are both inhibited. Therefore, the melt surface maintains a mirror state even when the silicon single crystal is pulled, and the mirror image of the criterion reflector 5 is readily observed.

As shown in FIG. 1(a), when the criterion reflector 5 is provided inside the concavity formed on the lower end surface 4a of the heat shielding member 4 located above the surface of the raw material melt 2, a high purity white quartz or a high purity transparent quartz having a whitened surface is preferably used as the criterion reflector 5. Use of such a material reduces the risk of contaminating the silicon single crystal 3 being grown by impurities from the criterion reflector 5 so that a high quality silicon single crystal 3 can be grown.

The lower end portion of the criterion reflector 5 is preferably located at a higher position than that of the lower end surface of the heat shielding member 4.

When the lower end portion of the criterion reflector 5 is located at a higher position than that of the lower end surface of the heat shielding member 4, the criterion reflector 5 does not protrude outside and can therefore be prevented from contacting the exterior in handling of the heat shielding member 4, such as installation and dismantlement so that the criterion reflector 5 can be prevented from being damaged.

Also, damage due to collision of the raw material can be inhibited when the raw material is added by using a quartz pipe. Moreover, the risk of attaching the raw material melt 2 to the criterion reflector 5 by mistake during operation such as a rise in the crucible 1 is eliminated. Note that, this arrangement can be realized by only the presence of the concave detection error inhibiting structure. When the concave detection error inhibiting structure is not formed, the shadow of the lower end surface of the heat shielding member covers the tip of the criterion reflector and therefore the fixed point observation of the tip of the criterion reflector by the binarization cannot be performed.

In many cases, a graphite material is used as the heat shielding member 4 located above the raw material melt 2 and the like. When the heat shielding member 4 is new or has been used only for a short time, there are few scattered melts thereon. Therefore, when the movement of the mirror image is observed with the fixed point observation apparatus 6, the image of the graphite material tends to be reflected on the surface of the silicon melt 2. In this case, use of a high purity white quartz or a high purity transparent quartz having a whitened surface as the criterion reflector 5 enhance the visibility of the mirror image on the surface of the raw material malt 2 by the fixed point observation apparatus 6 because of a white color of the criterion reflector 5, thereby enabling more precise observation of the mirror image and more precise measurement of the distance. Therefore, a higher purity, high quality silicon single crystal 3 can be grown.

For the heat shielding member 4 used for a long time, however, the image of the scattered melts on the lower end surface of the heat shielding member is reflected on the surface of the silicon melt 2 as well as the graphite material when the movement of the mirror image is observed with the fixed point observation apparatus 6. In the conventional structure, thus, even when the high purity white quartz or the high purity transparent quartz having a whitened surface is used as the criterion reflector 5, the visibility of the mirror image on the surface of the raw material malt 2 by the fixed point observation apparatus 6 is low because the colors of the criterion reflector 5 and the scattered melts are both white.

In the concave detection error inhibiting structure, on the other hand, the melts scattered on the concavity 4b drop down and are removed from the concavity 4b by gravity. Therefore, even for the heat shielding member 4 used for a long time, the scattered melts do not remain on the concavity 4b, and the visibility of the mirror image can be always kept high. Since the mirror image can be observed more stably and precisely, a high purity, high quality silicon single crystal 3 can be stably grown.

Figure 3:
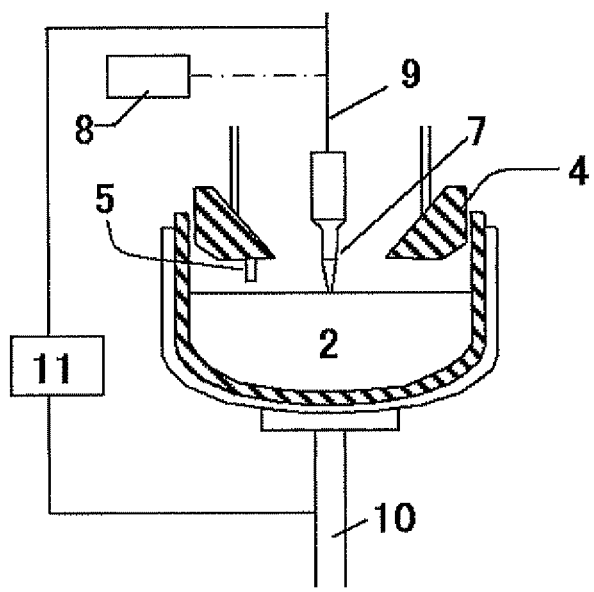
FIG. 3 is a diagram for explanation of a method for actually measuring the distance between the lower end surface of the heat shielding member and the surface of the raw material melt.

An example of the actual measurement of the distance A between the lower end of the heat shielding member 4 and the surface of the raw material melt 2 is given as the embodiment illustrated in FIG. 3. FIG. 3 is a diagram for explanation of the method for actually measuring the distance between the lower end surface of the heat shielding member 4 and the surface of the raw material melt 2.

A case of actually measuring the distance A between the lower end of the heat shielding member 4 and the surface of the raw material melt 2 by using the seed crystal 7 as shown in FIG. 3 will be described. The lower end of the seed crystal 7 for growing the silicon single crystal 3 is detected with the criterion position detector 8 provided above the raw material melt 2. The position of the lower end represents the criterion position. The height position of the lower end of the seed crystal 7 is then lowered to between the lower end portion of the criterion reflector 5 and the surface of the raw material melt 2. In the lowering operation, the seed crystal 7 is stopped at such a position that the position of the raw material melt surface defines a desired DPM when the lower end of the seed crystal 7 is brought into contact with the raw material melt 2 by raising the crucible 1 in a subsequent step. The lower end of the seed crystal 7 is then brought into contact with the raw material melt 2 by raising the crucible 1. The distance A between the lower end surface of the heat shielding member and the surface of the raw material melt can be actually measured on the basis of the distance from the position of the contact to the criterion position and a predetermined distance from the lower end surface of the heat shielding member to the criterion position.

The actual measurement of the distance A between the lower end surface of the heat shielding member and the surface of the raw material melt by using the seed crystal 7 can be performed with a simple operation. This measurement with the seed crystal 7 also reduces the risk of contaminating the raw material melt 2 by Impurities, thereby enabling a high quality silicon single crystal 3 to be grown. When the lower end of the seed crystal 7 is lowered to between the lower end portion of the criterion reflector and the surface of the raw material melt, there is less risk of attaching the raw material melt 2 to the criterion reflector 5 when the crucible 1 is raised to bring the seed crystal 7 into contact with the surface of the raw material melt. The raw material melt can be thereby prevented from being contaminated with the material of the criterion reflector. In addition, the lower end surface of the criterion reflector is prevented from being contaminated with extraneous substances, and its malfunction can be avoided.

As shown in FIG. 3, to sense the contact between the seed crystal 7 and the raw material melt 2, a wire 9 for hanging the seed crystal 7 and a crucible shaft 10 supporting the crucible 1 in which the raw material melt 2 is charged is electrically connected with a measurement apparatus 11. When the raw material melt 2 contacts the seed crystal 7 by raising the crucible 1, the measurement apparatus 11 senses in an electrical manner. At the time, the crucible position is recorded. The distance between the lower end surface of the heat shielding member and the surface of the raw material melt can be actually measured at the crucible position, i.e., a position at which the position of the raw material melt defines a desired DPM.

The position of the mirror image R1 of the criterion reflector 5 reflected on the surface of the raw material melt is observed with the fixed point observation apparatus 6 while the distance A between the lower end surface of the heat shielding member 4 and the surface of the raw material melt 2 is actually measured in the above manner.

Next, the silicon single crystal 3 is pulled with the apparatus as shown in FIG. 2. For example, the silicon single crystal manufacturing apparatus 20 includes a main chamber 12 that accommodates components such as the quartz crucible 1a, a pulling chamber 13 that is continuously provided above the main chamber 12, the heat shielding member 4 for controlling the crystal temperature gradient, a heater 14 for heating and melting a polycrystalline silicon raw material, a graphite crucible 1b for supporting the quartz crucible 1a, a heat insulating member 15 for preventing the main chamber 12 from being directly exposed to heat from the heater 14, the wire 9 for pulling the silicon single crystal, the crucible shaft 10 that supports the crucible 1, and a control unit 16 of the crucible position.

With the manufacturing apparatus 20, the silicon single crystal 3 can be pulled as follows. Before the actual measurement of the distance between the lower end surface of the heat shielding member and the surface of the raw material melt, a high purity polycrystalline silicon raw material is contained in the quartz crucible 1a in advance. The raw material is heated to a temperature more than the melting point of silicon (approximately 1420° C.) and melted with the heater 14 provided around the graphite crucible 1b to prepare the raw material melt 2. As described above, then, the distance between the lower end surface of the heat shielding member 4 and the surface of the raw material melt 2 is actually measured and the position of the mirror image R1 of the criterion reflector 5 reflected on the surface of the raw material melt is observed with the fixed point observation apparatus 6.

After the seed crystal 7 is brought into contact with the raw material melt 2, the wire 9 is gently wound up with a winding mechanism (not shown) and a neck portion is formed. The crystal diameter is then increased to grow a constant diameter part having a constant diameter.

In this case, the silicon single crystal 3 is pulled while the magnetic field is applied to the raw material melt 2 with a magnet 19. In particular, the magnetic field strength at the center (magnetic field strength at the center of a line connecting the coil center) of the applied magnetic field is preferably a horizontal magnetic field of 300 G to 7000 G. Since the surface of the raw material melt hardly vibrates under the above magnetic field strength, the fluctuation of the mirror image reflected on the surface of the raw material melt can be inhibited, the position of the surface of the raw material melt further stabilizes, and the movement distance of the mirror image can be measured more precisely.

Next, the method for measuring the distance between the lower end surface of the heat shielding member and the surface of the raw material melt while the silicon single crystal 3 is pulled will be described. The mirror image R1 of the criterion reflector 5 reflected on the surface of the raw material melt is captured at a position with the fixed point observation apparatus 6 before the silicon single crystal is pulled. As shown in FIG. 1(a), as the surface of the raw material melt is lowered from this position during the pulling of the silicon single crystal, the position of the mirror image of the criterion reflector 5 moves toward R2.

In this case, as shown in FIG. 1(b), with a measurement arithmetic unit 17 connected with the fixed point observation apparatus 6, the movement distance B of the mirror image from the position R1 to R2 is converted into the movement distance C of the surface of the raw material melt. This conversion can be carried out geometrically from the position and angle of the fixed point observation apparatus 6 and so on as follows: B=2C sin θ, wherein C represents the movement distance of the raw material melt 2, B represents the movement distance of the mirror image, and θ represents the angle of reflection of the mirror image. The movement distance C of the raw material melt can be calculated from the movement distance B of the mirror image obtained by the fixed point observation apparatus 6. The DPM when the mirror image is at the position R2 can be calculated by adding the actually measured distance A to the movement distance C of the raw material melt.

When θ is equal to or more than 30°, C is equal to or less than B, and slight movement of the raw material melt can be measured in a such manner that it is enlarged by the movement of the mirror image.

When the crucible position, i.e., the surface of the raw material melt is lowered, for example, by 20 mm before the silicon single crystal is pulled, a conversion factor may be calculated from the movement distance B of the mirror image being observed in advance to calculate the DPM more precisely. Note that examples of the fixed point observation apparatus 6 include a common optical camera (e.g., CCD camera), but this is not limited in particular.

When the conversion factor is calculated in advance, the distance between the lower end surface of the heat shielding member and the surface of the raw material melt can be precisely calculated from the actually measured distance A prior to the pulling of the silicon single crystal, and the movement distance C of the raw material melt surface calculated from the movement distance B of the mirror image only by obtaining the movement distance B of the mirror image with the fixed point observation apparatus 6 while the silicon single crystal is pulled. The actually measured distance A prior to the pulling of the silicon single crystal can be calculated by the control unit 16 of the crucible position.

Next, for control of the distance between the lower end surface of the heat shielding member and the surface of the raw material melt, the movement distance of the mirror image is observed throughout the pulling of the silicon single crystal 3, and feedback is continuously given from a distance between the lower end surface of the heat shielding member and the surface of the raw material melt, measured by the above measuring method. The crucible 1 or the heat shielding member 4 is preferably moved such that the distance between the lower end surface of the heat shielding member and the surface of the raw material melt becomes a predetermined distance. The crucible 1 can be moved by moving the crucible shaft 10 upwardly and downwardly. The heat shielding member 4 can be moved by moving a gas flow-guide cylinder upwardly and downwardly with a mechanism 18 for moving a gas flow-guide cylinder.

When the feedback from the DPM measurement is given while the silicon single crystal 3 is pulled and the crucible 1 or the heat shielding member 4 is moved such that the distance between the lower end surface of the heat shielding member and the surface of the raw material melt becomes a predetermined distance, the distance between the lower end surface of the heat shielding member and the surface of the raw material melt can be measured precisely and thereby controlled with high precision.

The distance (DPM) between the raw material melt and the heat shielding member provided above the melt is very important to grow a high quality silicon single crystal, such as a defect-free crystal. This is because a manufacturing margin of the defect-free crystal is very narrow and the defect-free crystal needs to achieve a defect-free state in all directions in a crystal plane; the temperature gradient near a crystal widely varies in dependence on a change of DPM; therefore, the DPM can be used as a control factor to equalize the temperature gradient at the center with that at the periphery. Since the temperature gradient in a crystal plane varies in a crystal length direction, the DPM needs to vary according to the crystal length to manufacture a crystal with no defect in a crystal length direction.

In view of this, when the silicon single crystal is manufactured while the distance between the lower end surface of the heat shielding member and the surface of the raw material melt is controlled by the above controlling method, since the distance between the lower end surface of the heat shielding member and the surface of the raw material melt can be controlled with high precision, the crystal axis temperature gradient in a crystal growth axis direction can be controlled highly precisely, and a high quality silicon single crystal can be efficiently manufactured at high productivity.

In the silicon single crystal manufactured by the above-described method for manufacturing a silicon single crystal, there is no defect on the entire plane in a radial direction and thus the defect-free region expands in the silicon single crystal so that the yield of the silicon single crystal manufacture is further improved.

EXAMPLE

The present invention will be more specifically described below with reference to Examples and Comparative Examples, but the present invention is not limited to these examples.

Example 1

The silicon single crystal manufacturing apparatus 20 shown in FIG. 2 was used. First, with the heat shielding member 4, used for a long time, having scattered melts attached thereon, the concavity 4b was formed on the lower end surface 4a of the heat shielding member and the criterion reflector 5 is provided inside the concavity. In the used criterion reflector 5, white quartz was attached to the tip of a hard transparent quartz rod. Next, a polycrystalline silicon raw material of 340 kg was charged into a 800 mm diameter quartz crucible 1a (for pulling a 300 mm diameter silicon single crystal). The polycrystalline silicon raw material was melted with the heater 14 and a horizontal magnetic field of 4000 G at its center was then applied with the magnet 19.

The DPM was then actually measured by using the seed crystal 7. In this measurement, the position of the lower end of the seed crystal 7 was detected as the criterion position with the criterion position detector 8 as shown in FIG. 3, the lower end of the seed crystal 7 was then positioned at such a position that the position of the raw material melt surface defined a desired DPM when the lower end of the seed crystal 7 was brought into contact with the raw material melt 2 by raising the crucible 1, and the lower end of the seed crystal 7 was brought into contact with the raw material melt 2 by raising the crucible 1. The distance A between the lower end surface of the heat shielding member and the surface of the raw material melt was actually measured on the basis of the distance from the position of the contact to the criterion position and a predetermined distance from the lower end surface of the heat shielding member to the criterion position. The contact between the raw material melt 2 and the seed crystal 7 was sensed with the measurement apparatus 11 by electric flow from the wire 9 to the crucible shaft 10. At the time of sensing, the value of DPM was set as the predetermined value for DPM and the position R1 of the mirror image of the criterion reflector 5 reflected on the raw material melt was detected with the fixed point observation apparatus (camera) 6. At this time, the conversion factor was also determined. More specifically, when the crucible 1 was moved below by 20 mm (the movement distance C of the raw material melt surface), the movement distance B of the mirror image was measured. Therefore, the movement distance C of the raw material melt surface was able to be calculated from the movement distance B of the mirror image while the silicon single crystal was pulled.

The silicon single crystal 3 was pulled and the DPM was measured in a state where the above setting was made. In the pulling, the DPM was not controlled.

Comparative Example 1

A silicon single crystal was pulled and the DPM was measured in the same conditions as Example 1 except that a heat shielding member, used for a long time, obtained by removing the concave detection error inhibiting structure 4b from the heat shielding member 4 used in Example 1 was used.

Figure 4:
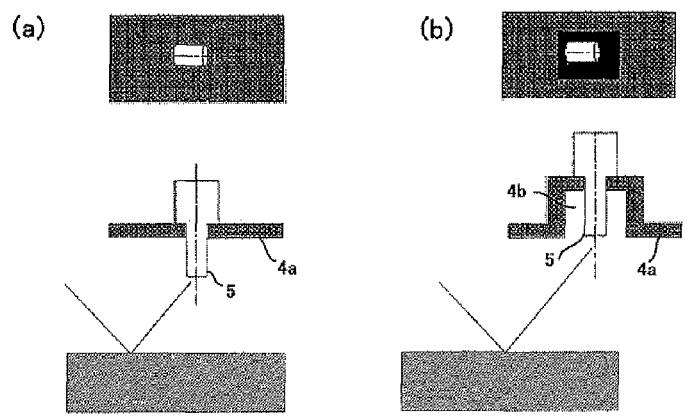
FIG. 4(a) is a schematic view of a heat shielding member and a criterion reflector used in the DPM measurement method of Comparative Example 1.
FIG. 4(b) is a schematic view of a heat shielding member and a criterion reflector including the detection error inhibiting structure used in the DPM measurement method of Example 1.

A schematic view of the heat shielding member and the criterion reflector used in the DPM measurement method of Comparative Example 1 is given in FIG. 4(a). A schematic view of the heat shielding member and the criterion reflector including the detection error inhibiting structure, used in the DPM measurement method of Example 1 is given in FIG. 4(b).

A level of detection error frequency was calculated when the DPMs of Comparative Example 1 and Example 1 were measured. Here, the definition of the detection error frequency was as follows: the case where an average detection value per 1 min changes by 0.2% or more with respect to an average detection value 1 min ago is considered as detection error; a relative value when the detection error frequency of Example 1 is set to 1 is considered as the level of detection error frequency (comparison of frequency of the detection error per a silicon single crystal). In Comparative Example 1, the detection error occurred due to the scattered melt. In Example 1, the detection error was inhibited to 1/100 or less (Comparative Example 1: Example 1=106:1), and it was thus confirmed that the DPM was able to be measured precisely.

Figure 5:
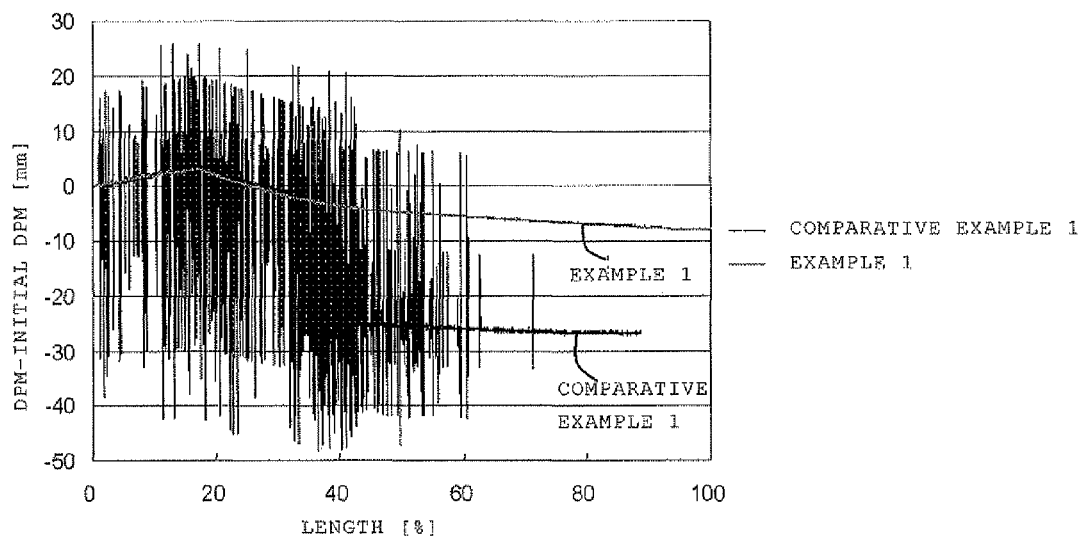
FIG. 5 is a diagram showing DPM measurement values of Comparative Example 1 and Example 1.

The DPM measurement values in Example 1 and Comparative Example 1 were shown in FIG. 5. As shown in FIG. 5, the DPM widely varied in Comparative Example 1, but stabilized in Example 1.

Example 2

A silicon single crystal 3 was pulled in the same conditions as Example 1 except for controlling the DPM. As described above, the DPM preferably varies continuously in crystal manufacture to increase the defect-free crystal region in the pulled silicon single crystal. In view of this, the silicon single crystal 3 was pulled while the crucible position was controlled with the crucible position control unit 16 so as to obtain a DPM of most preferable pattern in the same conditions as Example 1.

Comparative Example 2

A silicon single crystal 3 was pulled in the same conditions as Comparative Example 1 except for controlling the DPM. As described above, the DPM preferably varies continuously in crystal manufacture to increase the defect-free crystal region in the pulled silicon single crystal. In view of this, the silicon single crystal 3 was pulled while the crucible position was controlled with the crucible position control unit 16 so as to obtain a DPM of most preferable pattern in the same conditions as Comparative Example 1.

Figure 6:
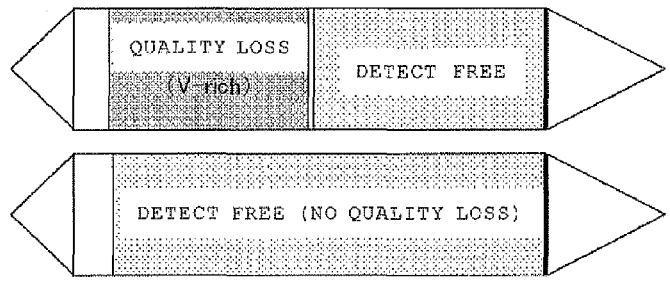
FIG. 6 is a diagram showing the degree of quality loss of the silicon single crystals manufactured in Comparative Example 2 and Example 2.

The degree of quality loss of the silicon single crystal manufactured in Comparative Example 2 and Example 2 is shown in FIG. 6. FIG. 6 shows that, in Comparative Example 2, the quality loss occurred because of control on the basis of the DPM containing the detection error and, in Example 2, the quality loss did not occur because of precise control of the DPM without the detection error.

Example 3

A silicon single crystal 3 was pulled and the DPM was measured in the same conditions as Example 1 except for using a new heat shielding member.

Comparative Example 3

A silicon single crystal 3 was pulled and the DPM was measured in the same conditions as Comparative Example 1 except for using a new heat shielding member.

Figure 7:
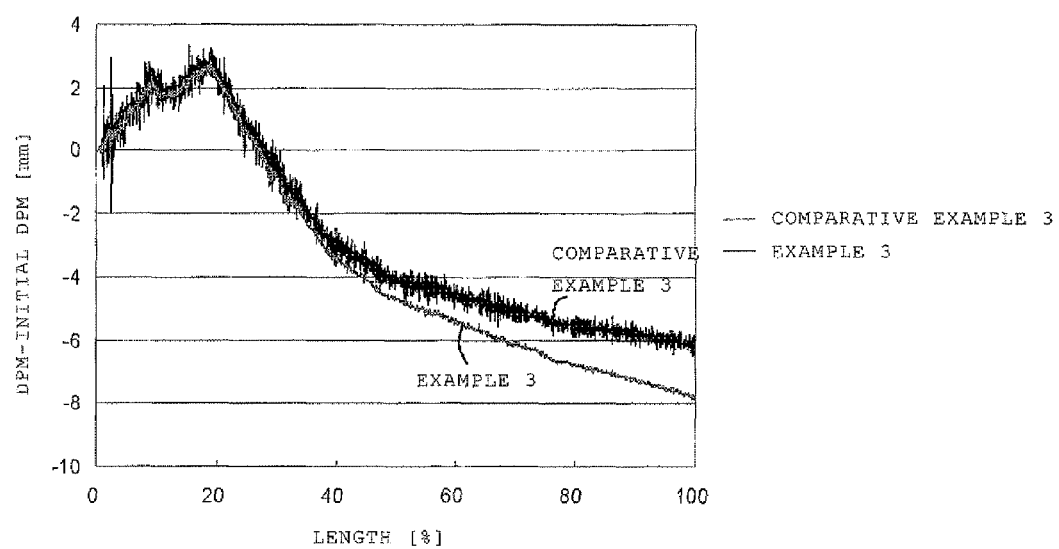
FIG. 7 is a diagram showing DPM measurement values of Comparative Example 3 and Example 3.

The level of detection error frequency was calculated when the DPMs of Comparative Example 3 and Example 3 were measured. In Comparative Example 3, the detection error occurred due to binarization error, even when the heat shielding member was new. In Example 3, the detection error due to binarization error was inhibited to 1/100 or less (Comparative Example 3: Example 3=108:1), and it was thus confirmed that the DPM was measured more precisely. The DPM measurement values in Example 3 and Comparative Example 3 are shown in FIG. 7. As shown in FIG. 7, the DPM measurement stabilized in Example 3, but did not stabilize in Comparative Example 3.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for measuring a distance between a lower end surface of a heat shielding member and a surface of a raw material melt comprising providing the heat shielding member with a criterion reflector, the heat shielding member being located above the surface of the raw material melt, when a silicon single crystal is pulled by the Czochralski method while a magnetic field is applied to the raw material melt in a crucible, the method including:
    providing the criterion reflector inside a concavity formed on the lower end surface of the heat shielding member;
    actually measuring the distance between the lower end surface of the heat shielding member and the surface of the raw material melt and observing a position of a mirror image of the criterion reflector with a fixed point observation apparatus, the mirror image being reflected on the surface of the raw material melt; and then
    measuring a movement distance of the mirror image with the fixed point observation apparatus and calculating the distance between the lower end surface of the heat shielding member and the surface of the raw material melt from the movement distance of the mirror image and the actually measured distance while the silicon single crystal is pulled.

2. The method according to claim 1, wherein a high purity white quartz or a high purity transparent quartz whitened is used as the criterion reflector.

3. The method according to claim 2, wherein a lower end portion of the criterion reflector is located at a higher position than that of the lower end surface of the heat shielding member.

4. The method according to claim 3, wherein, in the actual measurement of the distance between the lower end surface of the heat shielding member and the surface of the raw material melt, a lower end of a seed crystal for growing the silicon single crystal is detected as a criterion position with a criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

5. The method according to claim 4, wherein a magnetic field strength at a center of the applied magnetic field is a horizontal magnetic field of 300 G to 7000 G.

6. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 5.

7. A method for manufacturing a silicon single crystal, comprising manufacturing the silicon single crystal while the distance between the lower end surface of the heat shielding member and the surface of the raw material melt is controlled by the method according to claim 6.

8. The method according to claim 2, wherein, in the actual measurement of the distance between the lower end surface of the heat shielding member and the surface of the raw material melt, a lower end of a seed crystal for growing the silicon single crystal is detected as a criterion position with a criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

9. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 8.

10. A method for manufacturing a silicon single crystal, comprising manufacturing the silicon single crystal while the distance between the lower end surface of the heat shielding member and the surface of the raw material melt is controlled by the method according to claim 9.

11. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 2.

12. A method for manufacturing a silicon single crystal, comprising manufacturing the silicon single crystal while the distance between the lower end surface of the heat shielding member and the surface of the raw material melt is controlled by the method according to claim 11.

13. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 3.

14. A method for manufacturing a silicon single crystal, comprising manufacturing the silicon single crystal while the distance between the lower end surface of the heat shielding member and the surface of the raw material melt is controlled by the method according to claim 13.

15. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 4.

16. A method for manufacturing a silicon single crystal, comprising manufacturing the silicon single crystal while the distance between the lower end surface of the heat shielding member and the surface of the raw material melt is controlled by the method according to claim 15.

17. The method according to claim 1, wherein a lower end portion of the criterion reflector is located at a higher position than that of the lower end surface of the heat shielding member.

18. The method according to claim 17, wherein, in the actual measurement of the distance between the lower end surface of the heat shielding member and the surface of the raw material melt, a lower end of a seed crystal for growing the silicon single crystal is detected as a criterion position with a criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

19. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 18.

20. A method for manufacturing a silicon single crystal, comprising manufacturing the silicon single crystal while the distance between the lower end surface of the heat shielding member and the surface of the raw material melt is controlled by the method according to claim 19.

21. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 17.

22. A method for manufacturing a silicon single crystal, comprising manufacturing the silicon single crystal while the distance between the lower end surface of the heat shielding member and the surface of the raw material melt is controlled by the method according to claim 21.

23. The method according to claim 1, wherein, in the actual measurement of the distance between the lower end surface of the heat shielding member and the surface of the raw material melt, a lower end of a seed crystal for growing the silicon single crystal is detected as a criterion position with a criterion position detector provided above the raw material melt; then the lower end of the seed crystal is lowered to between the lower end portion of the criterion reflector and the surface of the raw material melt; the lower end of the seed crystal is brought into contact with the surface of the raw material melt by raising the crucible; and the distance between the lower end surface of the heat shielding member and the surface of the raw material melt is actually measured on a basis of a distance from a position of the contact to the criterion position and a distance from the lower end surface of the heat shielding member to the criterion position.

24. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 23.

25. A method for manufacturing a silicon single crystal, comprising manufacturing the silicon single crystal while the distance between the lower end surface of the heat shielding member and the surface of the raw material melt is controlled by the method according to claim 24.

26. The method according to claim 1, wherein a magnetic field strength at a center of the applied magnetic field is a horizontal magnetic field of 300 G to 7000 G.

27. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 26.

28. A method for manufacturing a silicon single crystal, comprising manufacturing the silicon single crystal while the distance between the lower end surface of the heat shielding member and the surface of the raw material melt is controlled by the method according to claim 27.

29. A method for controlling a distance between a lower end surface of a heat shielding member and a surface of a raw material melt, comprising moving the crucible or the heat shielding member while the silicon single crystal is pulled such that the distance between the lower end surface of the heat shielding member and the surface of the raw material melt becomes a predetermined value on a basis of feedback from a distance between the lower end surface of the heat shielding member and the surface of the raw material melt measured by the method according to claim 1.

30. A method for manufacturing a silicon single crystal, comprising manufacturing the silicon single crystal while the distance between the lower end surface of the heat shielding member and the surface of the raw material melt is controlled by the method according to claim 29.

* * * * *